(12) United States Patent
An et al.

(10) Patent No.: US 10,481,487 B2
(45) Date of Patent: Nov. 19, 2019

(54) MASK

(71) Applicant: Shenzehn China Star Optoelectronics Technology Co., Ltd., Shenzhen, Guangdong (CN)

(72) Inventors: Liyang An, Guangdong (CN); Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 243 days.

(21) Appl. No.: 15/577,322

(22) PCT Filed: Nov. 6, 2017

(86) PCT No.: PCT/CN2017/109594
§ 371 (c)(1),
(2) Date: Nov. 27, 2017

(87) PCT Pub. No.: WO2019/047358
PCT Pub. Date: Mar. 14, 2019

(65) Prior Publication Data
US 2019/0079385 A1   Mar. 14, 2019

(30) Foreign Application Priority Data
Sep. 11, 2017 (CN) .......... 2017 1 0816146

(51) Int. Cl.
*G03F 1/36* (2012.01)
*G03F 1/38* (2012.01)
(Continued)

(52) U.S. Cl.
CPC .............. *G03F 1/38* (2013.01); *G02F 1/1303* (2013.01); *G02F 1/13439* (2013.01);
(Continued)

(58) Field of Classification Search
CPC .. G03F 1/36; G03F 1/38; G02F 2001/134318; G02F 2201/121; G02F 1/1303; G02F 1/13439; G02F 1/134309
(Continued)

(56) References Cited

U.S. PATENT DOCUMENTS

2010/0123843 A1* 5/2010 Kim .......................... G03F 1/36
349/39
2010/0210053 A1* 8/2010 Kim ...................... G02F 1/1303
438/30
(Continued)

FOREIGN PATENT DOCUMENTS

| CN | 1497699 A | 5/2004 |
|---|---|---|
| CN | 101334586 A | 12/2008 |

(Continued)

OTHER PUBLICATIONS

CN_2017108161467_1stOA, (Apr. 2019).

Primary Examiner — John A McPherson
(74) Attorney, Agent, or Firm — Andrew C. Cheng

(57) ABSTRACT

A mask is provided for fabrication of a common electrode on an array substrate and includes a central portion, a first portion, and a second portion. The first portion is connected to the central portion and extends in a first direction. The second portion is connected to the central portion and extends in a second direction. The first direction and the second direction intersect each other. A first notch is formed in an interfacing site of the first portion and the central portion. A second notch is formed in an interfacing site of the second portion and the central portion. The second notch is connected to and in communication with the first notch to collectively form a first recessed zone. The mask helps reduce the potential risk of displaying defects appearing in a liquid crystal display panel using the array substrate.

20 Claims, 12 Drawing Sheets

(51) Int. Cl.
*G02F 1/1343* (2006.01)
*G02F 1/13* (2006.01)

(52) U.S. Cl.
CPC .......... *G02F 1/134309* (2013.01); *G03F 1/36* (2013.01); *G02F 2001/134318* (2013.01); *G02F 2201/121* (2013.01)

(58) Field of Classification Search
USPC ............................................................ 430/5
See application file for complete search history.

(56) References Cited

U.S. PATENT DOCUMENTS

| 2011/0269060 | A1 | 11/2011 | Shishido et al. | |
|---|---|---|---|---|
| 2012/0174046 | A1* | 7/2012 | Credendino | G03F 1/144 |
| | | | | 716/53 |
| 2015/0318316 | A1* | 11/2015 | Xin | B05B 12/20 |
| | | | | 257/347 |
| 2018/0180988 | A1* | 6/2018 | Zhang | G03F 1/38 |

FOREIGN PATENT DOCUMENTS

| CN | 102193303 A | 9/2011 |
|---|---|---|
| CN | 102411259 A | 4/2012 |
| CN | 104281000 A | 1/2015 |
| JP | 58200238 A | 11/1983 |
| JP | H1184629 A | 3/1999 |
| JP | 2013207182 A | 10/2013 |

\* cited by examiner

MASK

CROSS REFERENCE TO RELATED APPLICATIONS

This application claims the priority of Chinese Patent Application No. 201710816146.7 filed on Sep. 11, 2017, titled "Mask", the disclosure of which is incorporated herein by reference in its entirety.

BACKGROUND OF THE INVENTION

1. Field of the Invention

The present invention relates to the field of array substrate fabrication technology, and more particularly to a mask for use in fabrication of a common electrode provided on an array substrate

2. The Related Arts

The liquid crystal display panel industry has been developed for decades. The vertical alignment (VA) display mode is a common display mode of thin-film transistor liquid crystal displays (TFT-LCDs) for large-scale televisions due to advantages including wide view angle, high contrast, and requiring no rubbing alignment. Contrast is assessed according to the ratio between the brightness levels of the brightest condition and the darkest condition. The contents of a displayed image is displayed through differences between pixels and the simplest one of differences is "brightness" and "darkness", and the larges a difference between the two, the better that a person may perceive. The human eye pupils will constrict or dilate in response to environmental illumination in order to control the amount of light entering the eyes. Within a normal range of illumination, when the illumination of the surrounding environment get brighter, the human pupils constrict to reduce the amount of entering light, and oppositely, when the illumination of the surrounding environment gets less bright, the pupils dilate to allow a larger amount of light to enter. Thus, in a relative sense, the influence of contrast on the perception of human eyes is greater than that of brightness itself.

For a pixel of a known liquid crystal display panel, if intersecting common electrode lines are present in a display area, since surplus metal may appear in an intersecting site in an etching operation so as to an inclination edge (such as an inclination edge of 45°) may appear in the intersecting site of the common electrode lines to connect between two intersecting lines. Thus, it may easily show dark strips in the intersecting site in a VA display mode, making the displaying poor.

SUMMARY OF THE INVENTION

The present invention provides a mask. The mask is used to fabricate a common electrode provided on an array substrate. The mask helps reduces the potential risk of displaying defects appearing in a liquid crystal display panel involving the array substrate.

Embodiment of the present invention adopt the following technical solution:

A mask is provided for fabrication of a common electrode on an array substrate, comprising a central portion, a first portion, and a second portion, wherein the first portion is connected to the central portion and extends in a first direction and the second portion is connected to the central portion and extends in a second direction, the first direction and the second direction intersecting each other, a first notch being formed in an interfacing site of the first portion and the central portion, a second notch being formed in an interfacing site of the second portion and the central portion, the second notch being connected to and in communication with the first notch to collectively form a first recessed zone.

In the above, the mask further comprises a third portion, the third portion being connected to the central portion and extending in the third direction, the third direction and the first direction being opposite to each other, a third notch being formed in an interfacing site where the second portion is connected to the central portion, the third notch and the second notch being arranged opposite to each other, a fourth notch being formed in an interfacing site where the third portion is connected to the central portion, the fourth notch being connected to and in communication with the third notch to collectively form a second recessed zone.

In the above, the mask further comprises a fourth portion, the fourth portion being connected to the central portion and extending in a fourth direction, the fourth direction and the second direction being opposite to each other, a fifth notch being formed in an interfacing site where the third portion is connected to the central portion, the fifth notch and the fourth notch being arranged opposite to each other, a sixth notch being formed in an interfacing site where the first portion is connected to the central portion, the sixth notch and the first notch being arranged opposite to each other, a seventh notch and an eighth notch being formed in an interfacing site where the fourth portion is connected to the central portion and arranged opposite to each other, the seventh notch being connected to and in communication with the fifth notch to collectively form a third recessed zone, the eighth notch being connected to and in communication with the sixth notch to collectively form a fourth recessed zone.

In the above, the first direction and the second direction form therebetween an included angle of 60°-90°.

In the above, the first direction is perpendicular to the second direction.

In the above, a configuration of the first notch and a configuration of the second notch are identical and are arranged symmetric to each other.

In the above, a configuration of the third notch and a configuration of the second notch are identical and are arranged symmetric to each other.

In the above, the first recessed zone and the second recessed zone are arranged symmetric to each other with respect to the second portion.

In the above, in a direction perpendicular to the first direction, the first notch has a depth that is equal to or smaller than one half of a width of the first portion.

In the above, in a direction perpendicular to the second direction, the second notch has a depth that is equal to or smaller than one half of a width of the second portion.

In the present invention, since a first recessed zone is commonly formed in an interfacing site of a first portion and a central portion and an interfacing site of a second portion and the central portion of a mask, when the mask is used to form a common electrode, the first recessed zone corresponds in position to an intersecting zone of the common electrode so that surplus metal appearing in an etching operation and the first recessed zone are complementary to each other so as to form a regular and standard common electrode, whereby the common electrode can be arranged in a display area of the array substrate and reduce the potential risk of displaying defects appearing in a liquid crystal display panel to which the array substrate is applied.

BRIEF DESCRIPTION OF THE DRAWINGS

To more clearly explain the technical solution of the present invention, a brief description of the drawings that are necessary for embodiments of the present invention is given as follows. It is obvious that the drawings that will be described below show only some embodiments of the present invention. For those having ordinary skills of the art, other drawings may be available from these attached drawings without the expense of creative effort and endeavor.

DETAILED DESCRIPTION OF THE PREFERRED EMBODIMENTS

Figure 1:
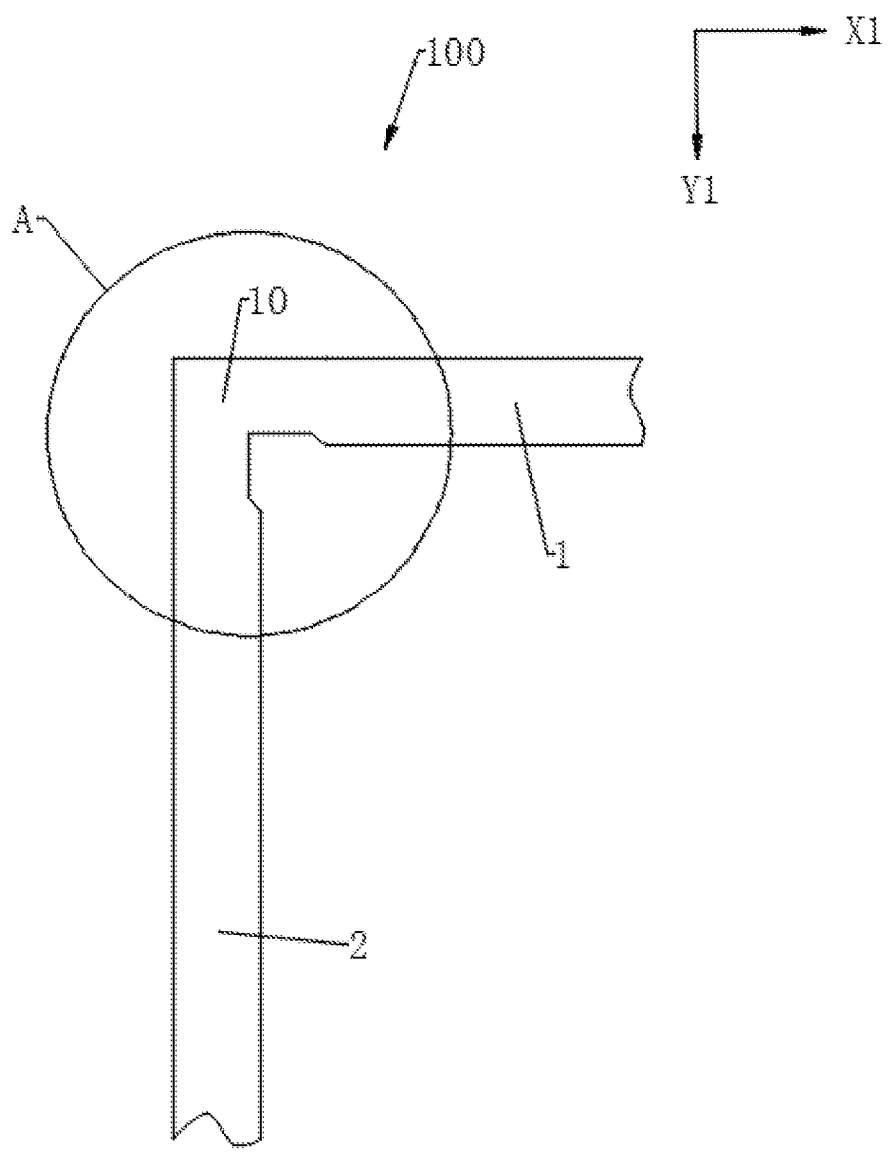
FIG. 1 is a schematic view illustrating a structure of an embodiment of a mask provided in embodiments of the present invention.

A description will be given to technical solutions provided by embodiments of the present invention with reference to the attached drawings of the embodiments of the present invention. However, the embodiments so described are only some, but not all, of the embodiments of the present invention. Other embodiments that are available to those having ordinary skills of the art based on the embodiment of the present invention, without the expense of creative effort and endeavor, are considered belonging to the scope of protection of the present invention.

In addition, the description given below for each embodiment is made with reference to the attached drawings to exemplify specific embodiments that the present invention may be put into practice. Direction related terminology used in the present invention, such as "up", "down", "front", "rear", "left", "right", "internal", "external", and "lateral", is provided as direction defined in the drawing sheets. Thus, using the direction related terminology, which is for better and more clearly describing and understanding of the present invention and is not for indicating or implying any specific orientation that a device or an element described must take or the device or element must be structured or operated at a specific orientation, should thus be appreciated as not imposing constraints to the present invention.

In the description of the present invention, it should be noted that unless specifically required and set, the terms "installation", "connection", "jointing", and "disposed on . . . "as used herein should be interpreted in a broad way, such as being fixedly connected or removably connected, or integrally connected; or being mechanically connected; or being directly connected, or indirectly connected with intervening media therebetween, or interiors of two element being in communication with each other. For those having ordinary skills in the art, the specific meaning of these terms used in the present invention can be appreciated for any actual situations.

Further, in the description of the present invention, unless stated otherwise, "multiple" means two or more than two. Terms related to "operations", if used in this specification, should means independent operations and for cases where distinction from other operations, any operation that achieve a desired effect of the operation is included in the terms so used. Further, the symbol "-" as used in this specification stands for a numeral range, which comprises a range of which the minimum and the maximum are respectively the figures set in front of and behind "-". In the drawings, units having similar or the same structure are designated with the same reference numerals.

Referring collectively to FIGS. 1-10, embodiments of the present invention provides a mask 100. The mask 100 is used to fabricate a common electrode 300 of an array substrate 200. The mask 100 comprises a central portion 10, a first portion 1, and a second portion 2. The first portion 1 is connected to the central portion 10 and extends in a first direction X1. The second portion 2 is connected to the central portion 10 and extends in a second direction Y1. The first direction X1 and the second direction Y1 intersect with each other (meaning the first direction X1 and the second direction Y1 form an included angle therebetween). A first notch 11 is formed in an interfacing site of the first portion 1 and the central portion 10 and a second notch 21 is formed in an interfacing site of the second portion 2 and the central portion 10. The second notch 21 is connected to and in communication with the first notch 11 to collectively define a first recessed zone 101.

Figure 10:
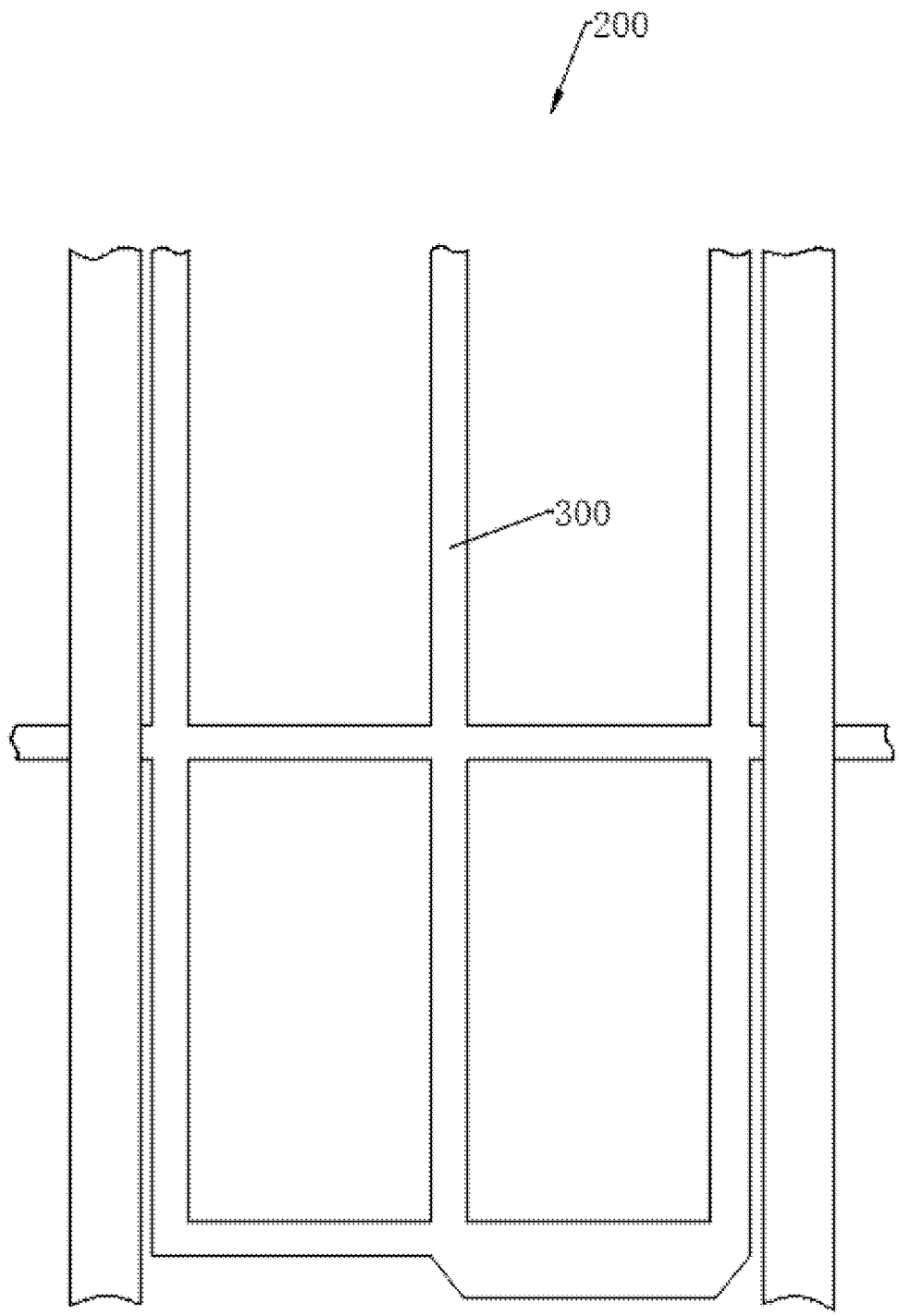
FIG. 10 is a schematic view illustrating an array substrate provided in the embodiments of the present invention.

In the instant embodiment, since the first recessed zone 101 is commonly formed in the interfacing site of the first portion 1 and the central portion 10 and the interfacing site of the second portion 2 and the central portion 10 of the mask 100, when the mask 100 is used to form the common electrode 300, the first recessed zone 101 corresponds in position to an intersecting zone of the common electrode 300 so that surplus metal appearing in an etching operation and the first recessed zone 101 are complementary to each other so as to form a regular and standard common electrode 300, whereby the common electrode 300 can be arranged in a display area of the array substrate 200 (as shown in FIG. 10) and reduce the potential risk of displaying defects appearing in a liquid crystal display panel to which the array substrate 200 is applied.

It can be appreciated that a photolithographic process may be applied to form the common electrode 300 on the array substrate 200, wherein the mask 100 is a mask that is applied in the photolithographic process. The photolithographic process is a process that is conducted through coating a photosensitive substance (which is also referred to as photoresist) on a surface of a substrate, which after being subjected to exposure (through the mask 100) and development, allows a portion thereof preserved to provide an effect of protection to the substrate, and finally, etching is applied to the substrate to form a desired patterned structure.

Figure 2:
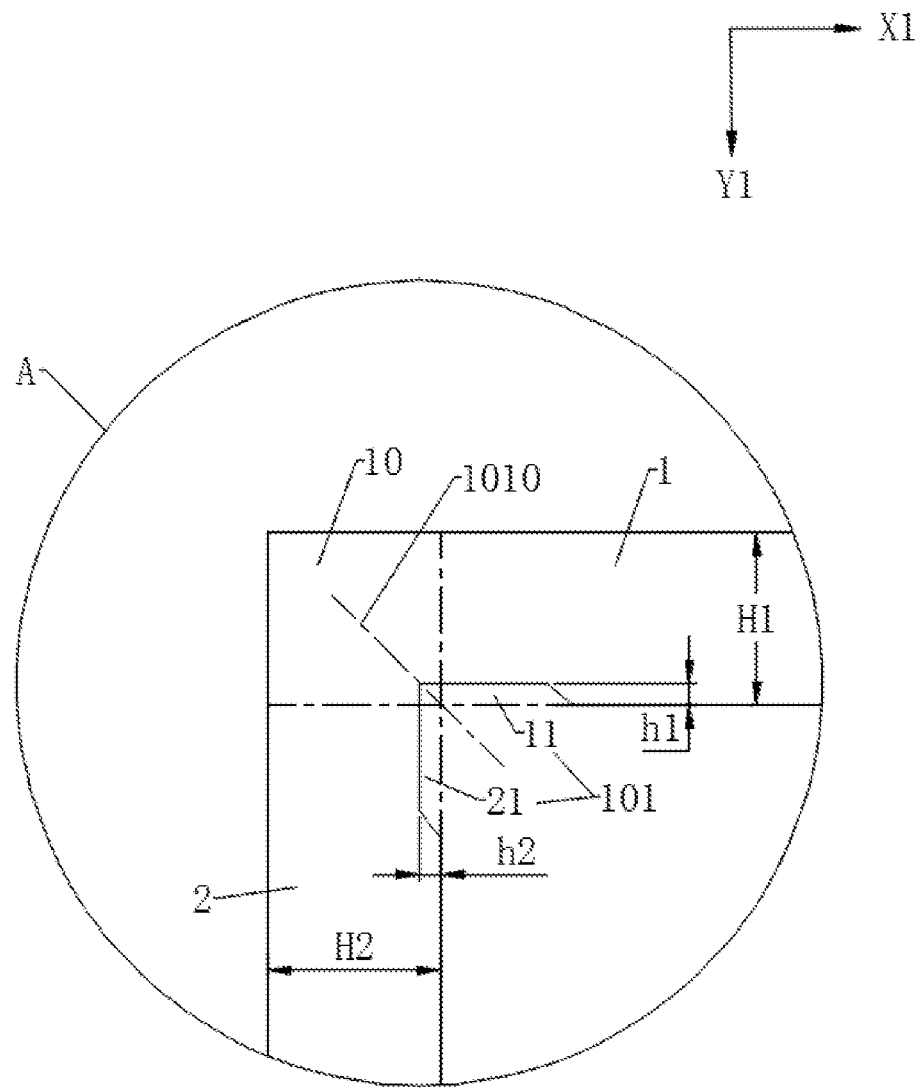
FIG. 2 is a schematic view, in an enlarged form, illustrating a circled portion that is marked "A" of the mask shown in FIG. 1.
Figure 3:
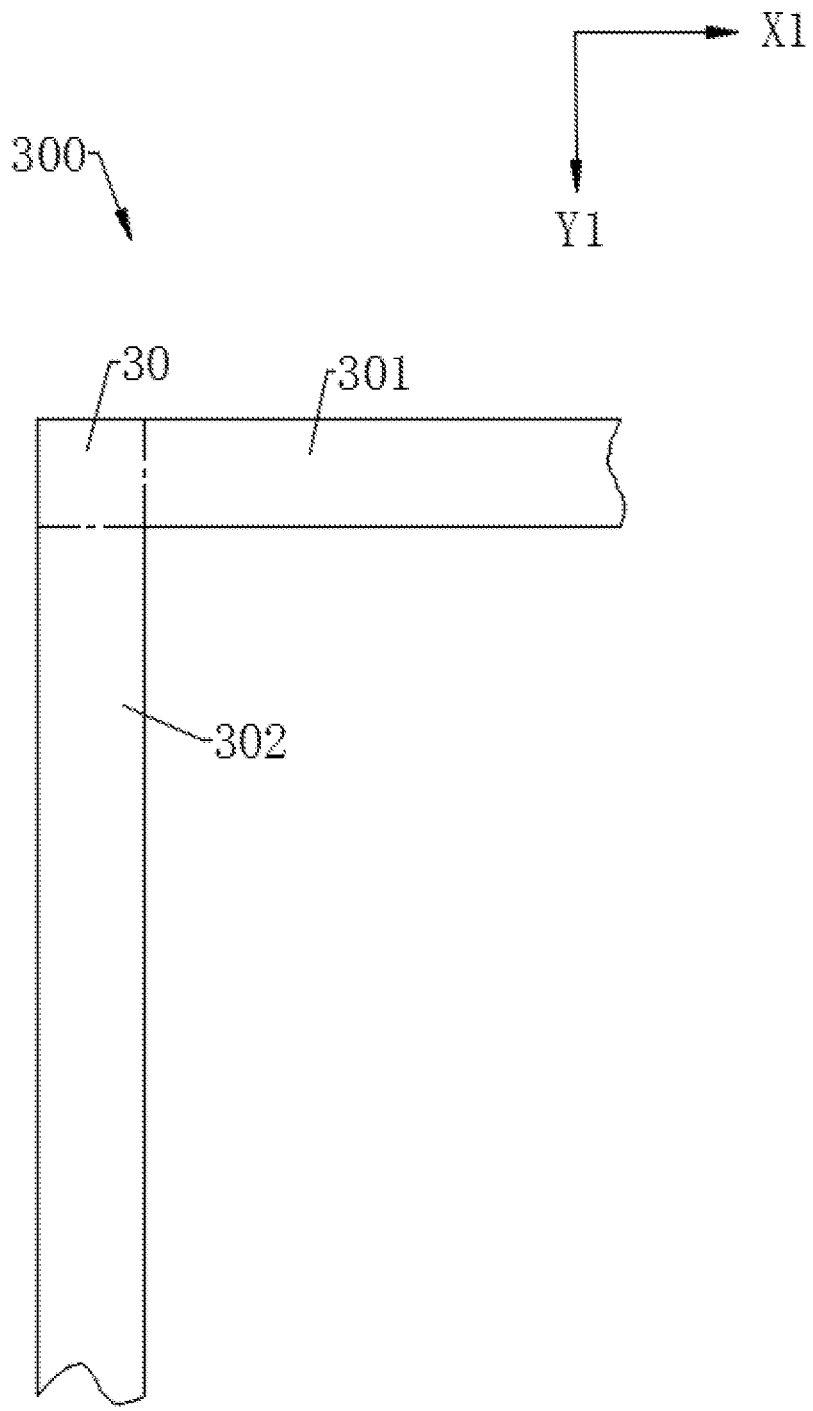
FIG. 3 is a schematic view illustrating a structure of a common electrode fabricated with the mask shown in FIG. 1.

In an embodiment, reference is made to FIGS. 1-3, FIG. 1 is a schematic view illustrating a structure of an embodiment of the mask 100; FIG. 2 is a schematic view, in an enlarged form, illustrating a circled portion "A" of the mask 100 shown in FIG. 1; and FIG. 3 is a schematic view illustrating a structure of the common electrode 300 fabricated with the mask 100 shown in FIG. 1. As shown in FIGS. 1 and 2, the mask 100 comprises a first recessed zone 101, and as shown in FIG. 3, the common electrode 300 includes an area that corresponds to the first portion 1 and is referred to as "first area" 301; the common electrode 300 includes an area that corresponds to the central portion and is referred to as "central area" 30; and the common electrode 300 has an area that corresponds to the second portion 2 and is referred to as "second area" 302. In a direction perpendicular to the first direction X1, the first area 301 and the central area 30 have identical dimensions and in a direction perpendicular to the second direction Y1, the second area 302 and the central area 30 have identical dimensions. The common electrode 300 shows a configuration that is regular and standard and avoids defects such as inclined edges occurring in the intersecting zone of the common electrode 300.

Figure 4:
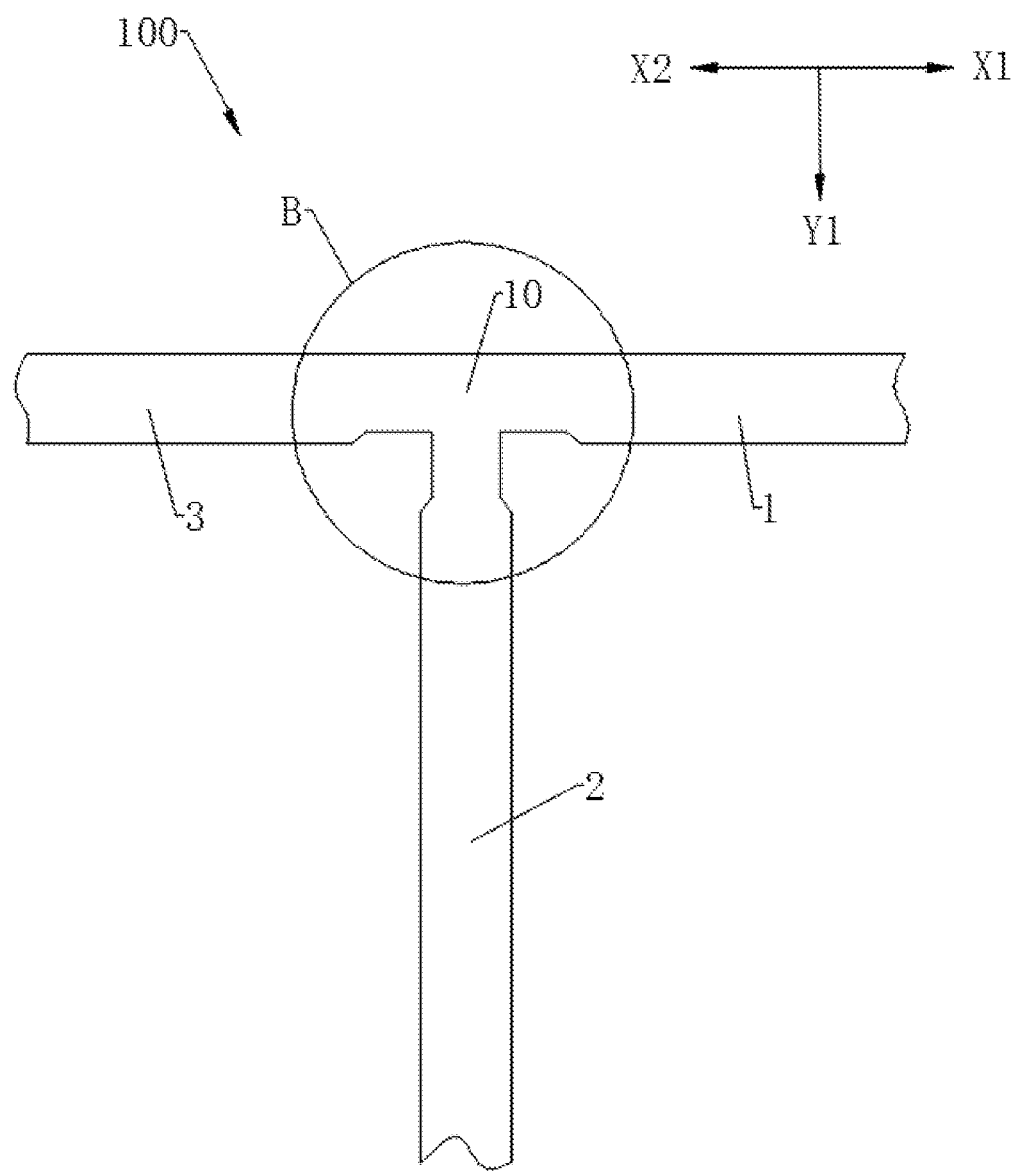
FIG. 4 is a schematic view illustrating a structure of another embodiment of the mask provided in embodiments of the present invention.
Figure 5:
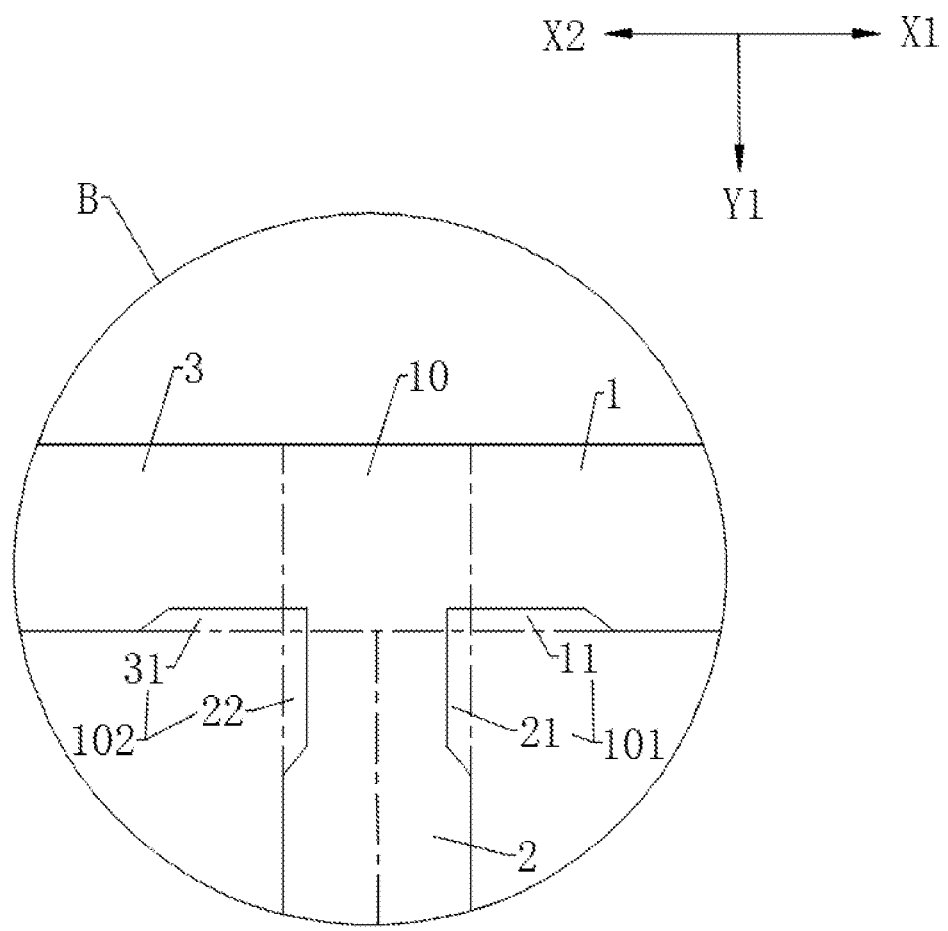
FIG. 5 is a schematic view, in an enlarged form, illustrating a circled portion that is marked "B" of the mask shown in FIG. 4.
Figure 6:
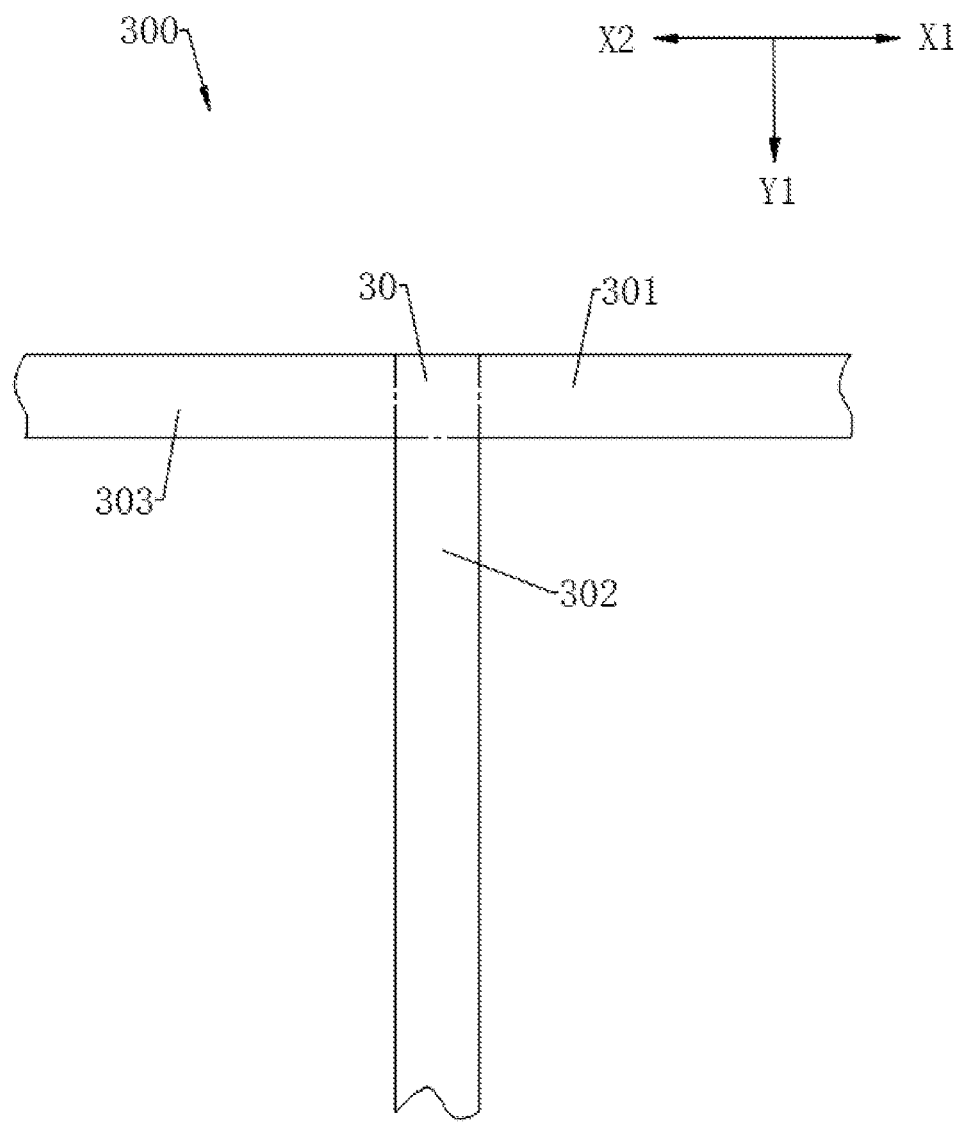
FIG. 6 is a schematic view illustrating a structure of a common electrode fabricated with the mask shown in FIG. 4.

In another embodiment, with reference to FIGS. 4-6, FIG. 4 is a schematic view illustrating a structure of said another embodiment of the mask 100; FIG. 5 is a schematic view, in an enlarged form, illustrating a circled portion "B" of the mask 100 shown in FIG. 4; and FIG. 6 is a schematic view illustrating a structure of the common electrode 300 fabricated with the mask 100 shown in FIG. 4.

The mask 100 may further comprise a third portion 3. The third portion 3 is connected to the central portion 10 and extends in a third direction X2. The third direction X2 and the first direction X1 are opposite to each other. A third notch 22 is also formed in the interfacing site where the second portion 2 is connected to the central portion 10 and the third notch 22 and the second notch 21 are opposite to each other. A fourth notch 31 is formed in an interfacing site where the third portion 3 is connected to the central portion 10 and the fourth notch 31 is connected to and in communication with the third notch 22 to collectively form a second recessed zone 102. The second recessed zone 102 and the first recessed zone 101 are spaced from each other.

As shown in FIGS. 4 and 5, the mask 100 comprises a first recessed zone 101 and a second recessed zone 102. As shown in FIG. 6, the common electrode 300 further comprises a third area 303 that corresponds to the third portion 33. In a direction perpendicular to the first direction X1, the first area 301, the central area 30, and the third area 303 have identical dimensions, and in a direction perpendicular to the second direction Y1, the second area 302 and the central area 30 have identical dimensions. The common electrode 300 shows a configuration that is regular and standard and avoids defects such as inclined edges occurring in the intersecting zone of the common electrode 300.

It is appreciated that in other embodiments, the third direction X2 can be a direction that is different from the first direction X1 and the second direction Y1.

Figure 7:
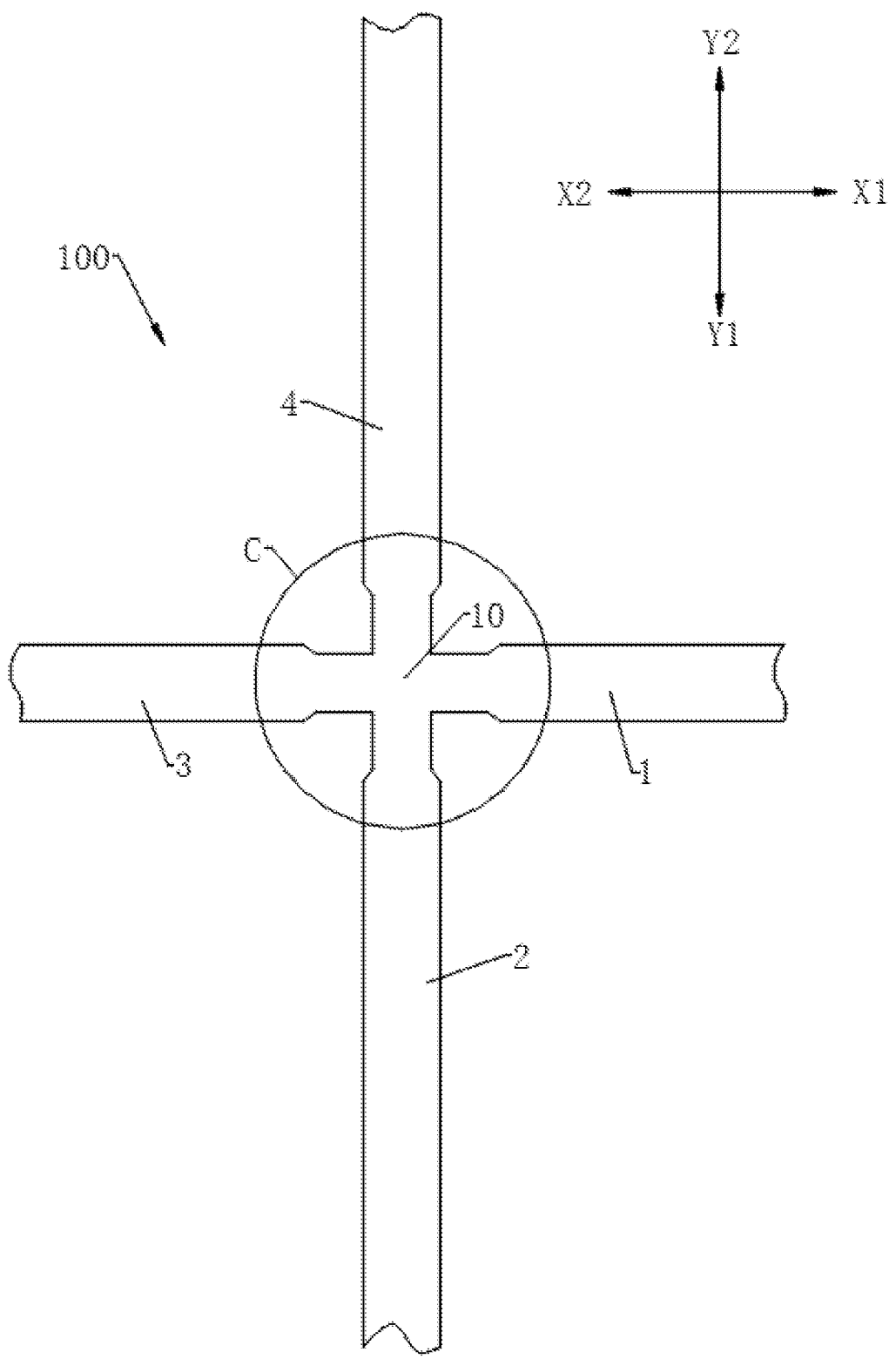
FIG. 7 is a schematic view illustrating a structure of a further embodiment of the mask provided in embodiments of the present invention.
Figure 8:
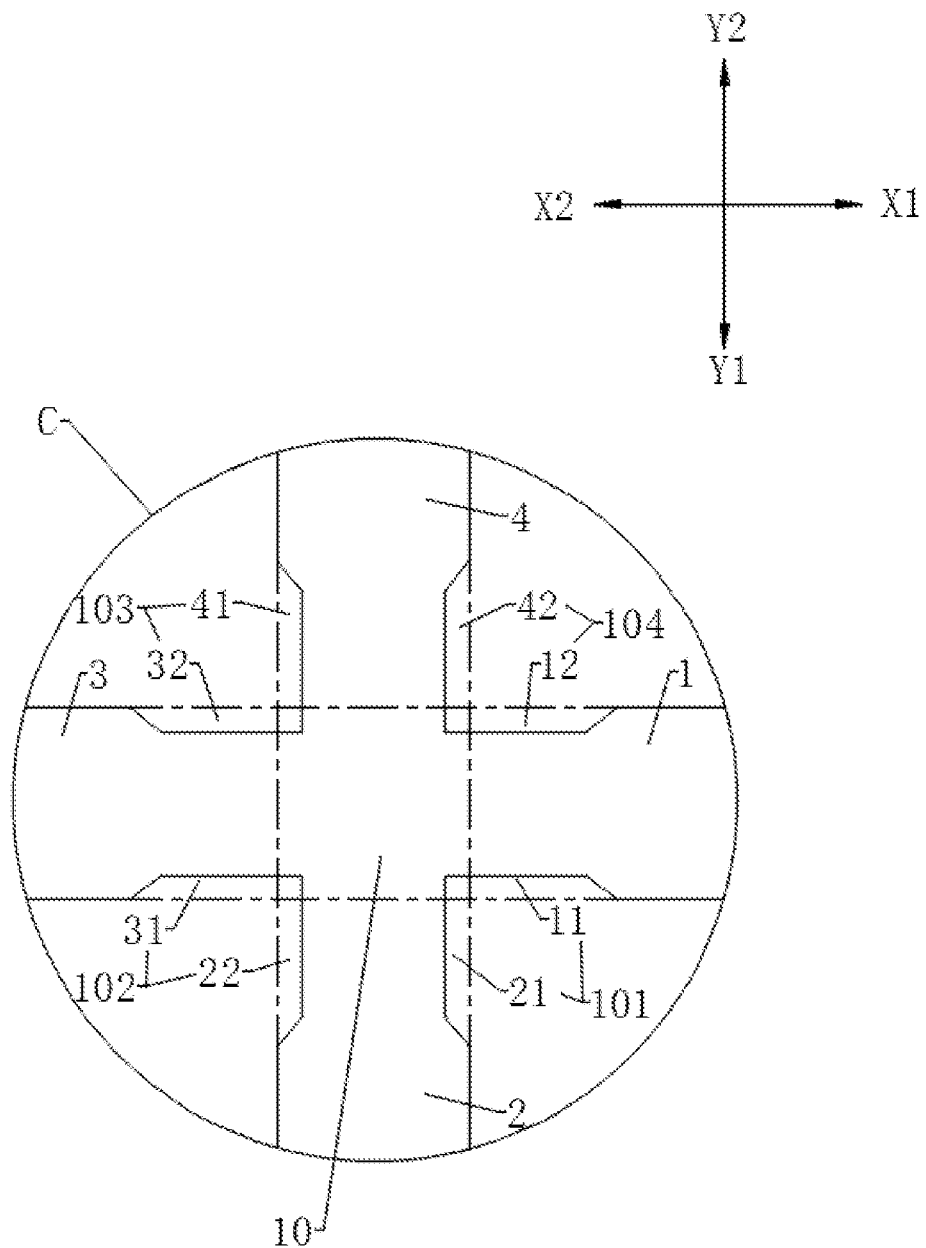
FIG. 8 is a schematic view, in an enlarged form, illustrating a circled portion that is marked "C" of the mask shown in FIG. 7.
Figure 9:
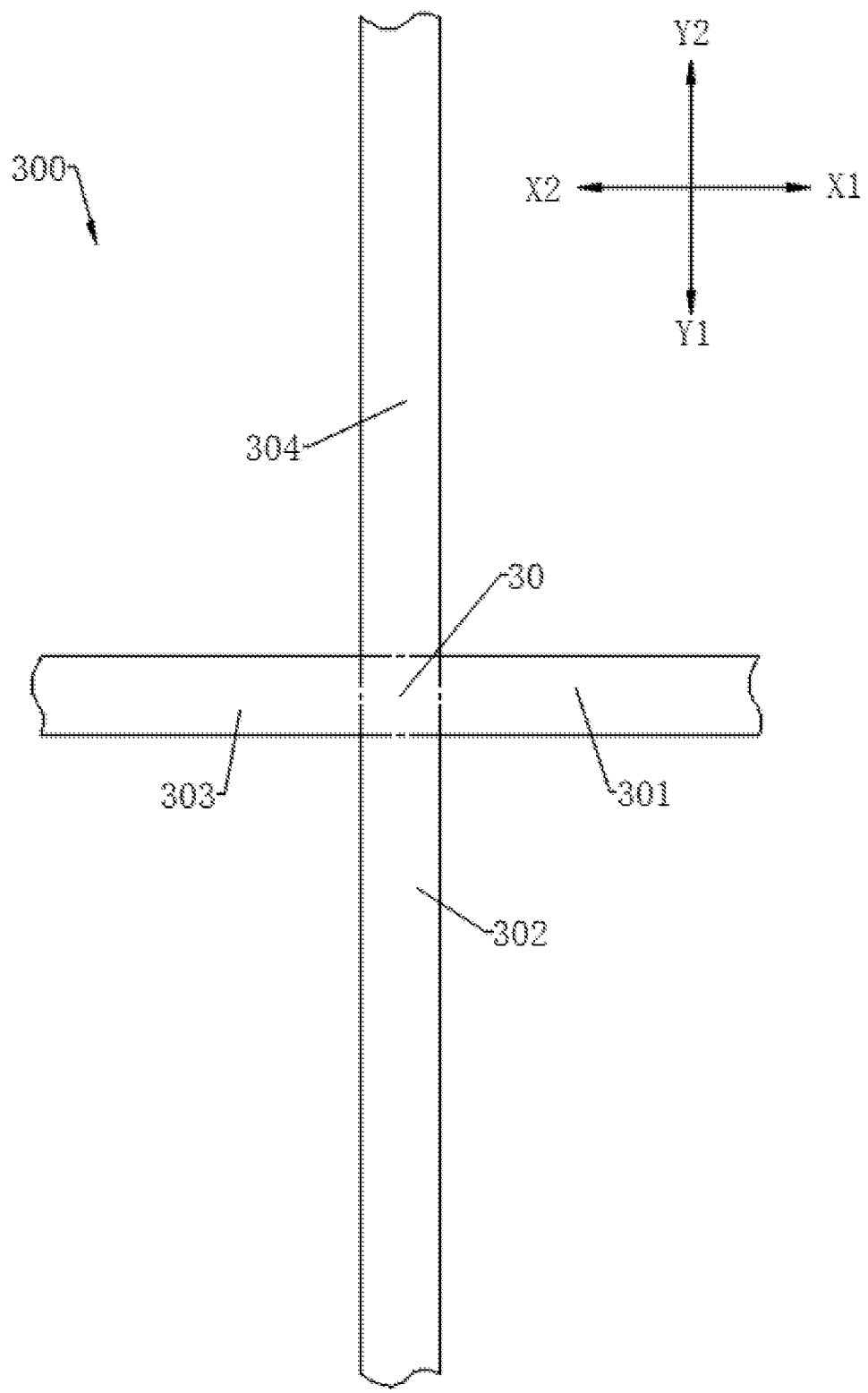
FIG. 9 is a schematic view illustrating a structure of a common electrode fabricated with the mask shown in FIG. 7.

In a further embodiment, with reference to FIGS. 7-9, FIG. 7 is a schematic view illustrating a structure of said further embodiment of the mask 100; FIG. 8 is a schematic view, in an enlarged form, illustrating a circled portion "C" of the mask 100 shown in FIG. 7; and FIG. 9 is a schematic view illustrating a structure of the common electrode 300 fabricated with the mask 100 shown in FIG. 7.

The mask 100 further comprises a fourth portion 4. The fourth portion 4 is connected to the central portion 10 and extends in a fourth direction Y2. The fourth direction Y2 and the second direction Y1 are opposite to each other. A fifth notch 32 is also formed in the interfacing site where the third portion 3 is connected to the central portion 10 and the fifth notch 32 and the fourth notch 31 are opposite to each other. A sixth notch 12 is also formed in the interfacing site where the first portion 1 is connected to the central portion 10 and the sixth notch 12 and the first notch 11 are opposite to each other. A seventh notch 41 and an eighth notch 42 are formed in an interfacing site where the fourth portion 4 is connected to the central portion 10. The seventh notch 41 is connected to and in communication with the fifth notch 32 to collectively form a third recessed zone 103, and the eighth notch 42 is connected to and in communication with the sixth notch 12 to collectively form a fourth recessed zone 104. The first recessed zone 101, the second recessed zone 102, the third recessed zone 103, and the fourth recessed zone 104 are spaced from each other.

As shown in FIGS. 7 and 8, the mask 100 comprises a first recessed zone 101, a second recessed zone 102, a third recessed zone 103, and a fourth recessed zone 104. As shown in FIG. 9, the common electrode 300 further comprises a fourth area 304. In a direction perpendicular to the first direction X1, the first area 301, the central area 30, and the third area 303 have identical dimensions and in a direction perpendicular to the second direction Y1, the second area 302, the central area 30, and the fourth area 304 have identical dimensions. The common electrode 300 shows a configuration that is regular and standard and avoids defects such as inclined edges occurring in the intersecting zone of the common electrode 300.

It is appreciated that in other embodiments, the fourth direction Y2 can be a direction that is different from the first direction X1, the second direction Y1, and the third direction X2.

It is contemplated that the mask 100 according to the present invention may comprise one or multiple ones of the structure shown in FIG. 1, the structure shown in FIG. 4, and the structure shown in FIG. 7.

Referring collectively to FIGS. 1-9, as an optional embodiment, the first direction X1 and the second direction Y1 form an inclined angle of 60°-90° therebetween. The size of the included angle between the first direction X1 and the second direction Y1 can be determined according to specific design requirements and no limitation is imposed thereto in this invention.

Optionally, the first direction X1 is made perpendicular to the second direction Y1. Under such a condition, as shown in FIG. 1, the first portion 1, the central portion 10, and the second portion 2 generally form a right-angled configuration. As shown in FIG. 4, the first portion 1, the central portion 10, the second portion 2, and the third portion 3 generally form a T-shaped configuration. As shown in FIG. 7, the first portion 1, the central portion 10, the second portion 2, the third portion 3, and the fourth portion 4 generally form a cross configuration.

Referring collectively to FIGS. 1-9, 11, and 12, as an optional embodiment, a configuration of the first notch 11 and a configuration of the second notch 21 are generally identical and are arranged symmetric with respect to each other. For an included angle between the first direction and the second direction being referred to as α, an included angle formed by a symmetry axis 1010 of the first notch 11 and the second notch 21 with respect to the first direction X1 is of a size of α/2, and that with respect to the second direction Y1 is of a size of α/2. The symmetry axis 1010 of the first notch 11 and the second notch 21 passes through a center point of the central portion 10.

A configuration of the third notch 22 and a configuration of the second notch 21 are generally identical and are arranged symmetric with respect to each other (having a symmetry axis that is a center line of the second portion 2). The other notches may be understood by referring to the arrangement of the first notch 11, the second notch 21, and the third notch 31.

Optionally, the first recessed zone 101 and the second recessed zone 102 are arranged symmetric about the second portion 2 (namely a center line of the second portion 2). The third recessed zone 103 and the second recessed zone 102 are arranged symmetric about the third portion 3 (namely a center line of the third portion 3). The fourth recessed zone 104 and the third recessed zone 103 are arranged symmetric about the fourth portion 4 (namely a center line of the fourth portion 4). The first recessed zone 101 and the fourth recessed zone 104 are arranged symmetric about the first portion 1 (namely a center line of the first portion 1).

Figure 11:
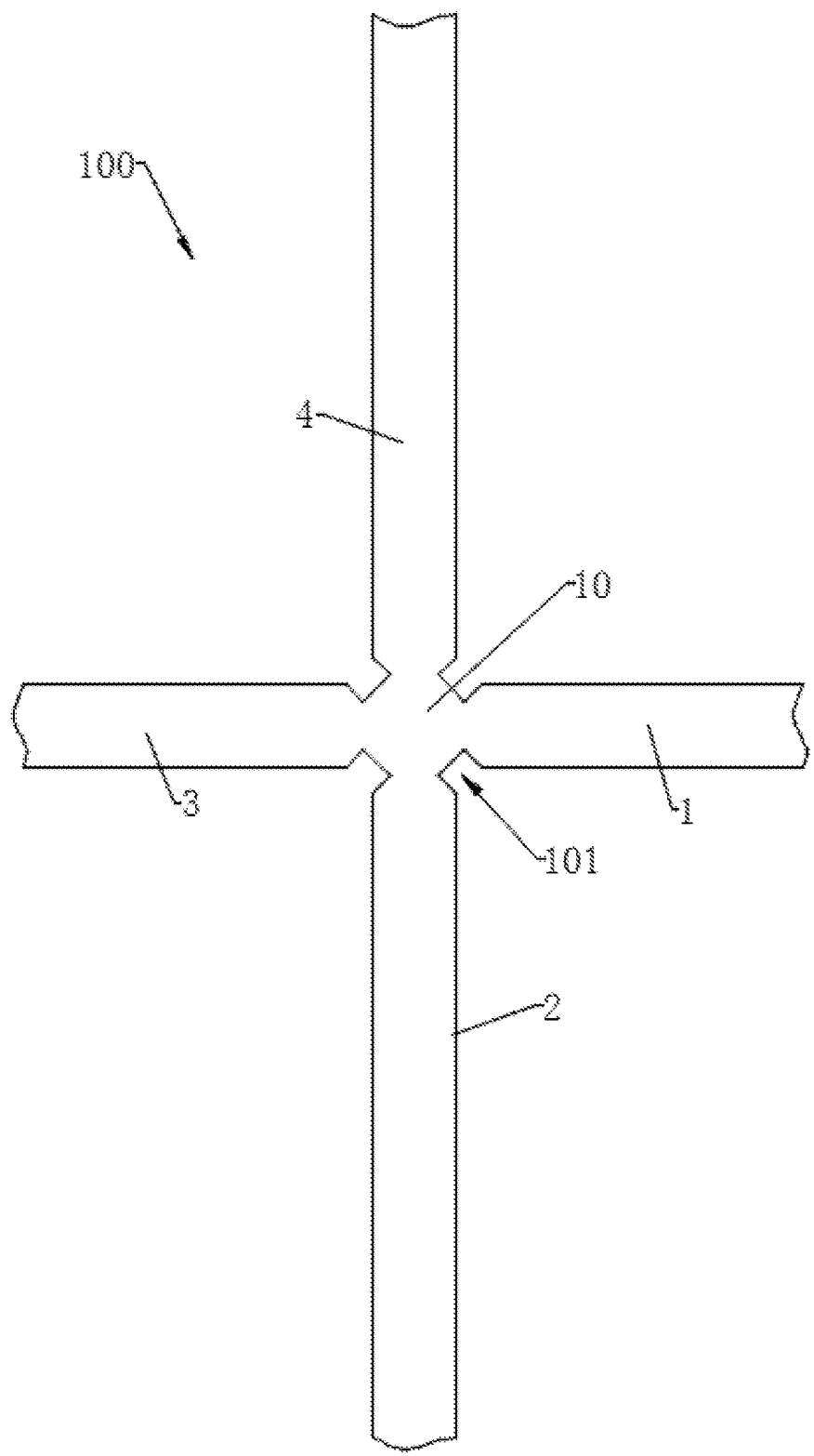
FIG. 11 is a schematic view illustrating a structure of yet a further embodiment of the mask provided in embodiments of the present invention.
Figure 12:
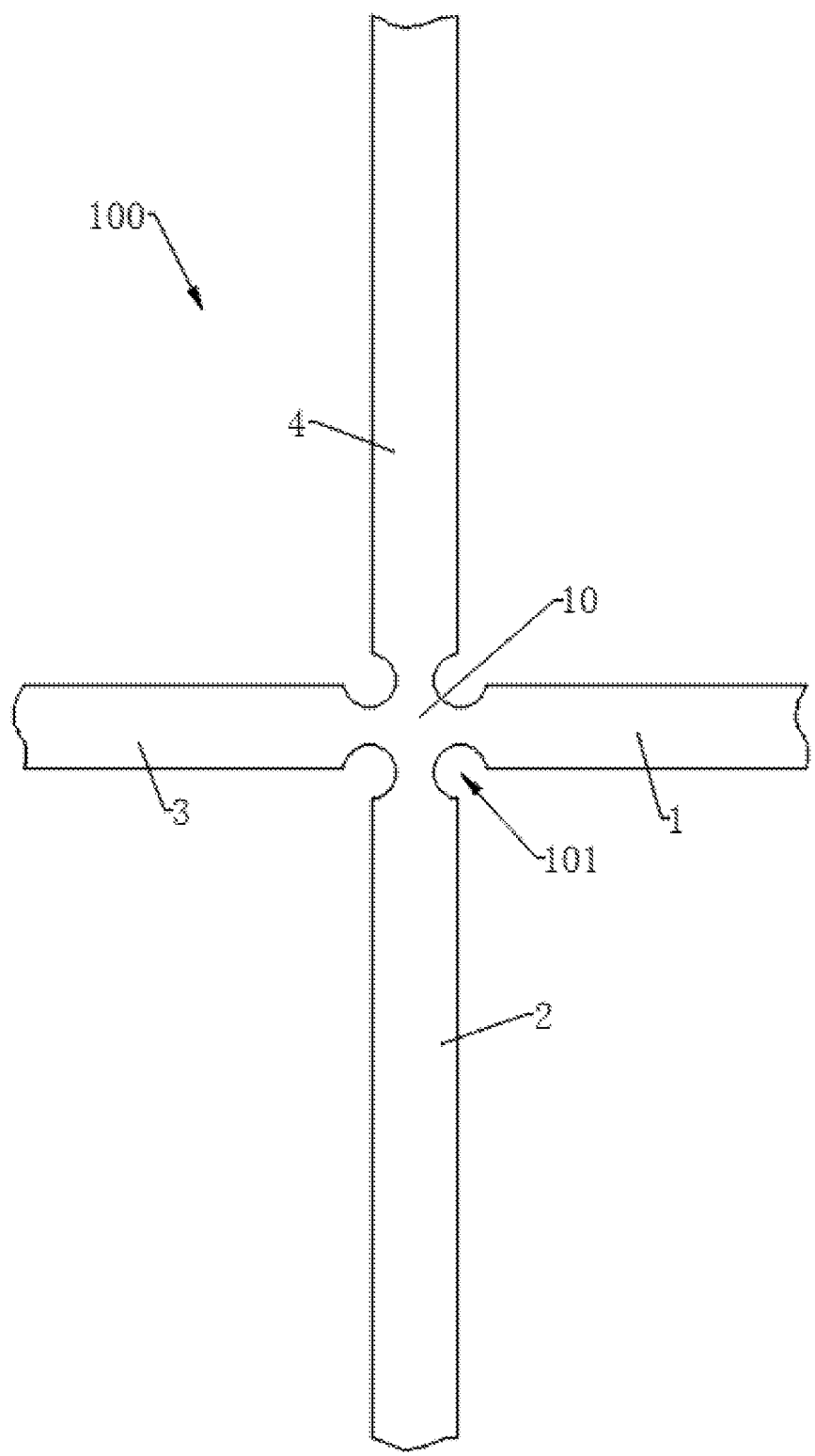
FIG. 12 is a schematic view illustrating a structure of yet a further embodiment of the mask provided in embodiments of the present invention.

The first recessed zone 101 can be of a right-angled shape (as shown in FIGS. 1-9), a rectangle (as shown in FIG. 11), or a shape of a circular arc (as shown in FIG. 12).

Referring collectively to FIGS. 1-12, as an optional embodiment, in a direction perpendicular to the first direction X1, the first notch 11 has a depth h1 that is equal to or smaller than one half of a width H1 of the first portion 1. Under this condition, the mask 100 is structured to prevent a size of the central area 30 of the common electrode 300 from exceeding a size of the first area 301 of the common electrode 300 and also to prevent the size of the central area 30 of the common electrode 300 from being significantly smaller than the size of the first area 301 of the common electrode 300 due to the size of the first recessed zone 101 being excessively large and the common electrode 300 is regular in dimension. A configuration of the third portion 3 may be realized through reference to that of the first portion.

Referring collectively to FIGS. 1-12, as an optional embodiment, in a direction perpendicular to the second direction Y1, the second notch 21 has a depth h2 that is equal to or smaller than one half of a width H2 of the second portion 2. Under this condition, the mask 100 is structured to prevent the size of the central area 30 of the common electrode 300 from exceeding a size of the second area 302 of the common electrode 300 and also to prevent the size of the central area 30 of the common electrode 300 from being significantly smaller than the size of the second area 302 of the common electrode 300 due to the size of the second recessed zone 102 being excessively large and the common electrode 300 is regular in dimension. A configuration of the fourth portion 4 may be realized through reference to that of the second portion 2.

The above provides a detailed description of embodiments of the present invention. Specific examples are used in the specification to expound the principle and embodying ways of the present invention. The description of the embodiments is provided to help understanding of the methodology of the present invention, as well as the essential idea thereof. Further, for those having ordinary skills in the art, it can be contemplated to make modifications, based on the idea of the present invention, on the embodiments and applications thereof. In conclusion, the specification should not be interpreted as constraints to the scope of the present invention.

What is claimed is:

1. A mask, which is adopted to fabricate a common electrode on an array substrate, comprising a central portion, a first portion, and a second portion, wherein the first portion is connected to the central portion and extends in a first direction and the second portion is connected to the central portion and extends in a second direction, the first direction and the second direction intersecting each other, a first notch being formed in an interfacing site of the first portion and the central portion, a second notch being formed in an interfacing site of the second portion and the central portion, the second notch being connected to and in communication with the first notch to collectively form a first recessed zone.

2. The mask according to claim 1, wherein the mask further comprises a third portion, the third portion being connected to the central portion and extending in the third direction, the third direction and the first direction being opposite to each other, a third notch being formed in an interfacing site where the second portion is connected to the central portion, the third notch and the second notch being arranged opposite to each other, a fourth notch being formed in an interfacing site where the third portion is connected to the central portion, the fourth notch being connected to and in communication with the third notch to collectively form a second recessed zone.

3. The mask according to claim 2, wherein the mask further comprises a fourth portion, the fourth portion being connected to the central portion and extending in a fourth direction, the fourth direction and the second direction being opposite to each other, a fifth notch being formed in an interfacing site where the third portion is connected to the central portion, the fifth notch and the fourth notch being arranged opposite to each other, a sixth notch being formed in an interfacing site where the first portion is connected to the central portion, the sixth notch and the first notch being arranged opposite to each other, a seventh notch and an eighth notch being formed in an interfacing site where the fourth portion is connected to the central portion and arranged opposite to each other, the seventh notch being connected to and in communication with the fifth notch to collectively form a third recessed zone, the eighth notch being connected to and in communication with the sixth notch to collectively form a fourth recessed zone.

4. The mask according to claim 3, wherein the first direction and the second direction form therebetween an included angle of 60°-90°.

5. The mask according to claim 4, wherein the first direction is perpendicular to the second direction.

6. The mask according to claim 3, wherein a configuration of the first notch and a configuration of the second notch are identical and are arranged symmetric to each other.

7. The mask according to claim 3, wherein a configuration of the third notch and a configuration of the second notch are identical and are arranged symmetric to each other.

8. The mask according to claim 3, wherein the first recessed zone and the second recessed zone are arranged symmetric to each other with respect to the second portion.

9. The mask according to claim 3, wherein in a direction perpendicular to the first direction, the first notch has a depth that is equal to or smaller than one half of a width of the first portion.

10. The mask according to claim 2, wherein the first direction and the second direction form therebetween an included angle of 60°-90°.

11. The mask according to claim 10, wherein the first direction is perpendicular to the second direction.

12. The mask according to claim 2, wherein a configuration of the first notch and a configuration of the second notch are identical and are arranged symmetric to each other.

13. The mask according to claim 2, wherein a configuration of the third notch and a configuration of the second notch are identical and are arranged symmetric to each other.

14. The mask according to claim 2, wherein the first recessed zone and the second recessed zone are arranged symmetric to each other with respect to the second portion.

15. The mask according to claim 2, wherein in a direction perpendicular to the first direction, the first notch has a depth that is equal to or smaller than one half of a width of the first portion.

16. The mask according to claim 1, wherein the first direction and the second direction form therebetween an included angle of 60°-90°.

17. The mask according to claim 16, wherein the first direction is perpendicular to the second direction.

18. The mask according to claim 1, wherein a configuration of the first notch and a configuration of the second notch are identical and are arranged symmetric to each other.

19. The mask according to claim 1, wherein in a direction perpendicular to the first direction, the first notch has a depth that is equal to or smaller than one half of a width of the first portion.

20. The mask according to claim 19, wherein in a direction perpendicular to the second direction, the second notch has a depth that is equal to or smaller than one half of a width of the second portion.

* * * * *